United States Patent
Honkura (10) Patent No.: US 10,473,732 B2
(45) Date of Patent: Nov. 12, 2019

(54) MAGNETOMETER WITH A DIFFERENTIAL-TYPE INTEGRATED CIRCUIT FOR MI SENSOR AND GSR

(71) Applicant: MAGNEDESIGN CORPORATION, Chita-gun, Aichi-ken (JP)

(72) Inventor: Yoshinobu Honkura, Aichi-ken (JP)

(73) Assignee: Magnedesign Corporation, Aichi-ken (JP)

( * ) Notice: Subject to any disclaimer, the term of this patent is extended or adjusted under 35 U.S.C. 154(b) by 0 days.

(21) Appl. No.: 15/379,426

(22) Filed: Dec. 14, 2016

(65) Prior Publication Data

US 2017/0176547 A1  Jun. 22, 2017

(30) Foreign Application Priority Data

Dec. 18, 2015  (JP) ................................. 2015-246972

(51) Int. Cl.
  *G01R 33/02*  (2006.01)
  *G01R 33/00*  (2006.01)
  *G01R 33/028*  (2006.01)

(52) U.S. Cl.
  CPC ......... *G01R 33/02* (2013.01); *G01R 33/0023* (2013.01); *G01R 33/028* (2013.01)

(58) Field of Classification Search
  CPC .............................. G01R 33/02; G01R 33/063
  See application file for complete search history.

(56) References Cited

U.S. PATENT DOCUMENTS

| | | | | |
|---|---|---|---|---|
| 3,504,277 A * | 3/1970 | Mogilevsky | ....... | G01R 33/0283 324/257 |
| 5,302,899 A * | 4/1994 | Schett | .................. | G01R 33/389 324/317 |
| 7,375,515 B2 * | 5/2008 | Omagari | ................ | G01R 33/02 324/225 |
| 9,404,980 B2 * | 8/2016 | Honkura | ................ | G01R 33/09 |
| 9,500,721 B2 * | 11/2016 | Yamamoto | ........... | G01R 33/063 |
| 2001/0030537 A1 * | 10/2001 | Honkura | ................ | G01R 33/02 324/249 |
| 2003/0164765 A1 * | 9/2003 | Sumi | ..................... | G01R 33/02 340/551 |

(Continued)

FOREIGN PATENT DOCUMENTS

| JP | 2002365349 A | 12/2001 | | |
|---|---|---|---|---|
| JP | 2008134236 A | 6/2008 | | |
| WO | WO 2014115765 A1 * | 7/2014 | ......... | G01R 33/0023 |

OTHER PUBLICATIONS

Sandler, Impedance measurements stabilize op-amp buffers, EDN Network. (Year: 2014).*

(Continued)

*Primary Examiner* — Jermele M Hollington
*Assistant Examiner* — Sean Curtis
(74) *Attorney, Agent, or Firm* — Kilpatrick Townsend & Stockton LLP (57) ABSTRACT

A magnetometer provides a newly designed signal processing circuit that can reduce noise and increase the magnetic sensitivity by means of reducing the noise of GND electrode potential occurred at the timing when the pulse current passes through the magnetic wire. It is characterized by preparing a differential element with a neutral coil electrode, a differential sample holding circuit and a differential amplifier circuit.

4 Claims, 4 Drawing Sheets

(56) References Cited

U.S. PATENT DOCUMENTS

| | | | | |
|---|---|---|---|---|
| 2006/0038561 A1* | 2/2006 | Honkura | ................ | G01R 33/02 324/253 |
| 2011/0080164 A1* | 4/2011 | Honkura | ................ | B82Y 25/00 324/244 |
| 2013/0169267 A1* | 7/2013 | Miyakoshi | ............. | G01R 15/14 324/117 R |
| 2015/0219731 A1* | 8/2015 | Yamamoto | ............. | G01R 33/09 324/252 |
| 2015/0234017 A1* | 8/2015 | Yamamoto | ........... | G01R 33/063 324/244 |
| 2015/0355294 A1* | 12/2015 | Honkura | ............ | G01R 33/0023 324/252 |
| 2017/0176547 A1* | 6/2017 | Honkura | ................ | G01R 33/02 |

OTHER PUBLICATIONS

N/A, How to Build a Voltage Stabilizer Circuit using a Buffer, LearnAboutElectronics.com (Year: 2016).*

Wayback reference date for "How to Build a Voltage Stabilizer Circuit using a Buffer" (Year: 2018).*

\* cited by examiner

MAGNETOMETER WITH A DIFFERENTIAL-TYPE INTEGRATED CIRCUIT FOR MI SENSOR AND GSR

CROSS-REFERENCES TO RELATED APPLICATIONS

This application claims the priority of Japanese Patent Application No. 2015-246972 filed on Dec. 18, 2015, entitled "Magnetometer with a Differential Type Integrated Circuit," which is incorporated herein by reference.

BACKGROUND OF THE INVENTION

Technical Field

The present invention relates to a magnetometer with a differential-type integrated circuit that can improve its performance in sensitivity, noise, size and power consumption.

Background Art

High sensitive micro-magnetometers have been used to detect bio-magnetism, the earth magnetism and so on. Nowadays, they are widely used for mobiles phones, smartphones, etc. MI sensors and GSR sensors operated by high frequency pulse current are well known as common types of those micro-magnetometers. They comprise a magnetic sensitive part made by an amorphous wire composed of CoFeSiB and a coil wound around its magnetic wire.

The MI sensor is based on a magneto-impedance effect caused by a surface effect of high frequency current from 1 MHz to 100 MHz when it passes through the amorphous wire with a circular anisotropic magnetic field on the surface. There are two types of MI sensors. One directly detects the change of wire impedance proportional to an external magnetic field. The other detects it indirectly using the coil wound around the wire. As used herein, MI is an abbreviation for magneto-impedance.

The GSR sensor is based on the GSR effect caused by spin rotations excited by a current pulse with frequency of from 0.5 GHz to 4 GHz when it passes through the amorphous wire with a circular spin aliment domain on the surface. The micro coil wound around the wire can detect the coil voltage proportional to the external magnetic field caused by the GSR effect. As used herein, GSR is an abbreviation for GHz-spin rotation.

The coil voltages of MI sensors and GSR sensors depend on the current strength of pulse current. Saturation tends to occur, offering stable output when the current strength is large. As an example, a current strength of over 200 mA causes saturation applied to the amorphous wires with the anisotropy field of 20 Gauss and the diameter of 10 μm. Another example is that the current strength of over 400 mA causes saturation applied to the amorphous wires with the anisotropy field of 20 Gauss and the diameter of 20 μm.

The pulse current with proper frequency and proper current strength makes a large coil voltage that can improve the magnetic sensitivity of the magnetometer. But when it passes through the wire, large variations of a grand electrode potential (referred to as "GND" hereinafter) occur to make large noise in the electronics circuit for the sensor.

An integrated electronic circuit (referred to as "ASIC" hereinafter) is more sensitive to this problem than a discrete electronic circuit assembled from separate electronic parts. The reason is that an ASIC receives interference from the GND of the wire and the GND of the coil more strongly than that of the discrete circuit and the GND of the circuit fluctuates to make large noise in the circuit.

Prior-art inventions for solving the problem are, for example, those described in Patent Document 1 and Patent Document 2. Patent Document 1 relates to an impedance-type MI sensor that measures the wire impedance change excited by pulse current with a frequency of from 1 MHz to 100 MHz. The invention in Patent Document 1 detects a differential voltage with two MI elements with a right turn bias coil and a left turn bias coil that make the same but opposite voltages sensitive to the external magnetic field. The differential voltage is detected by a differential sample hold circuit and by a differential amplified circuit. When the pulse current passes through the wire, the difference between two wire GND potentials of the two MI elements become so large that the noise caused by GND fluctuations becomes not so small.

Patent Document 2 relates to a coil type MI sensor that measures the coil voltage proportional to the wire impedance change indirectly excited by pulse current with a frequency of from 1 MHz to 100 MHz. The invention in Patent Document 2 detects the coil voltage by separating three GNDs of the wire GND, the coil GND and the processing circuit GND to decrease the coil GND fluctuations caused by the big wire GND fluctuations when the pulse current passes through the wire. At the same time, the invention described in this document decreases noise with the same phase using a differential amplified circuit. The GND of the coil and the GND of the differential amplified circuit are connected directly, but the noise of both GND is not exactly the same so that the invention described in this document cannot decease the noise so effectively especially when the GND receives large fluctuations excited by large pulse current.

Recently, there is a growing demand for highly sensitive micro-magnetometers for improvement in the sensitivity, noise, size, current consumption, etc. Efforts for improving their performance are being made by some means such as increasing the pulse frequency of from 10 MHz to 1 GHz, making small size coils with a coil pitch from 30 μm to 3 decreasing the wire diameter from 40 μm to 10 μm with the ASIC process rules changed from 350 nm to 130 nm. The noise is apt to become larger due to a higher frequency of the pulse current, a smaller size of the pickup coil and finer process rules applied when a large pulse current passes.

PATENT DOCUMENTS

Patent Document 1: Japanese Unexamined Patent Application Publication No. 2002-365349
Patent Document 2: Japanese Unexamined Patent Application Publication No. 2008-134236

BRIEF SUMMARY OF THE INVENTION

Technical Problems

The object of the present invention is to improve the performance of magnetometers in sensitivity, noise, size, power consumption, etc., by developing a newly designed electronic circuit that can remove undesirable effect on the noise caused by big GND electrical potential fluctuates when large pulse current passes through the wire of a MI sensor or a GSR sensor.

Means to Solve Technical Problems

The inventor carried out numerous experiments for solving the problem and then created a newly designed circuit that can remove undesirable effect on the noise to signal ratio caused by electrode potential fluctuations of the wire GND, the coil GND, the sample hold circuit GND and the amplified circuit GND. The newly designed circuit comprises a differential element with one wire and two coils divided by a middle coil point with two wire electrodes, two coil electrodes and a neutral coil electrode, a differential sample hold circuit and a differential amplifier or a differential ADC. It can obtain the difference coil voltage between the voltages of two coils without any undesirable effect from the large GND fluctuations at the moment of pulse current passage.

Both coil voltages of the differential coils show the same value with opposite signs against the neutral coil electrode serving as the reference potential. The voltage values are a little different due to the GND fluctuations. However, when both coil voltages are held in the differential sample hold circuit and successively transferred to the differential amplifier or the differential ADC to output the sensor signal, undesirable effect on the signal can be almost perfectly eliminated from the signal to provide an exact output voltage proportional to the external magnetic field.

The electrode potential of the neutral coil electrode fluctuates significantly because of the pulse current passage and as a result, both coil voltages of the differential element are also varied. Nevertheless the difference of both coil voltages, in other words, the total voltage of the differential coil is kept constant free from undesirable effect caused by GND fluctuations.

Effect of the Invention

The present magnetometer with a differential-type integrated circuit can detect the coil voltage proportional to the external magnetic field free from the bad influence to the signal voltage caused by the fluctuations of GND electrical potential at the moment of the pulse current passage. Therefore, it can improve its signal-noise ratio, resulting in an excellent high sensitive micro-magnetometer having high magnetic sensitivity, low noise, small size and small power consumption.

DETAILED DESCRIPTION OF THE INVENTION

A magnetometer with a differential-type integrated circuit according to the present invention comprises a differential element with a magnetic wire sensitive to a magnetic field, a coil wound around its magnetic wire to pick up the change of the wire longitudinal magnetizing and five electrodes that consists of two wire electrodes, two coil electrodes and a neutral coil electrode, a pulse generator circuit that supplies the pulse current to the magnetic wire, an adjustment circuit for detection timing, a differential sample holding circuit that holds two coil output voltage with the same absolute voltage value of opposite signs against a reference electrode potential set up by the neutral coil electrode, a differential amplifier circuit that amplifies the difference voltage between two sample holding coil output voltages and a neutral potential stabilizing circuit for keeping the voltage of the neutral coil electrode around a middle value of an electronics circuit power source.

When the coil voltage is considerably large, a differential ADC can be used instead of the differential amplifier circuit. Moreover, in the case that the pickup coil has a resistance of over 100Ω, it is desirable that two coil voltage of the differential element is inputted to the differential sample hold circuit through a buffer circuit.

The coil of the differential element is divided to a plus coil and a minus coil at its center point that connects to the neutral coil electrode. Both pickup coil voltages detected between the output electrodes and the neutral coil electrode have the same voltage value with opposite signs.

Many kinds of pickup coils may be used in the present invention, such as a single coil type with a left turn coil or a right turn coil and unit coil types combined with a right turn coil and a left turn coil or two right turn coils and two left turn coils and so on. The differential element must have a symmetric configuration between the plus coil and the minus coil against the neutral coil electrode as the symmetric point. In this embodiment, the plus or minus coil outputs a pulse or minus signed signal proportional to the pulse or minus magnetic field. The right or left turn coil is defined as the right or left twisted coil toward plus the magnetic field respectively.

The electrode potential of the neutral coil electrode is set to be a half of the potential of the electronics circuit power source to make the output voltage of the differential amplifier circuit zero. But it is adjusted by the neutral potential stabilizing circuit to make the output voltage of the differential amplifier zero when not zero induced voltage caused by parasite capacitance of the coils or wire antenna effect occurs in spite of the external magnetic field strength of zero.

The pulse generator generates the pulse current to supply it to the magnetic wire and can control the rising time or the falling time of the pulse current from 0.2 nsec to 5 nsec, that is, a pulse frequency of from 0.1 Ghz to 2.5 GHz. It can also control the pulse current strength from 10 mA to 500 mA. The magnetic wire with a wire length of 0.1 mm to 4 mm, a diameter of 1 μm to 15 μm and a wire resistance of 2Ω to 100Ω are applicable. The VDD power source voltage is desirably kept in the range from 1 V to 15 V for supplying a pulse current with a current strength of from 10 mA to 500 mA.

A sampling hold circuit comprises an electronics switch and a sample holding capacitor. The electronic switch turns off at the moment when the coil output voltage reaches a peak voltage by means of the adjustment circuit. The peak voltage is held in the holding capacitor. The adjustment circuit for detection timing can control the detection timing time from 0.2 nsec to 10 nsec dependent on the delayed time of the peak coil voltage from the switch off timing of the electronic switch.

The holding capacitor has a capacitance of from 2 pF to 100 pF. When the pickup coil resistance is considerably large or over 1KΩ, the buffer circuit must be used before the sample holding circuit for preventing decrease in the coil voltage due to IR voltage drop and the capacitance is desirably over 10 pF for suppressing the noise.

When the pickup coil resistance is considerably small or under 200Ω, the pickup coil can connect to the sample holding circuit directly but it is recommended that the capacity of the capacitor should be from 3 pF to 5 pF and the average number of times of the final output signal should be increased to suppress the noise accompanied with the capacitor of small capacitance.

The differential sample hold circuit is formed by two sample hold circuits comprising the electronic switch and the holding capacitor and their common GND electrode connecting to the neutral coil electrode of the differential element.

The electrode potential of the neutral coil electrode fluctuates significantly at the moment of pulse current passage, but the difference voltages between the two voltages of the two sample hold circuits or two amplifier circuits are the same as the difference coil voltage without any undesirable effect in spite of the big GND fluctuations at the moment of pulse current passage.

When the coil voltage becomes large enough due to a large number of coil turns in the coil, the differential ADC is used instead of the differential amplifier circuit. The omission of the differential amplifier circuit is advantage to decrease the noise and the size of its ASIC.

When the coil resistance is more than 200Ω, especially more than 1 KΩ accompanied with a large number of coil turns, the buffer circuit must be set between the differential element and the differential sample hold circuit for suppressing IR voltage drop of the coil voltage caused by the coil current and the coil resistance. The buffer circuit used in the present invention is disclosed in Japanese Patent No. 5678358.

EXAMPLES

Example 1

Figure 1:
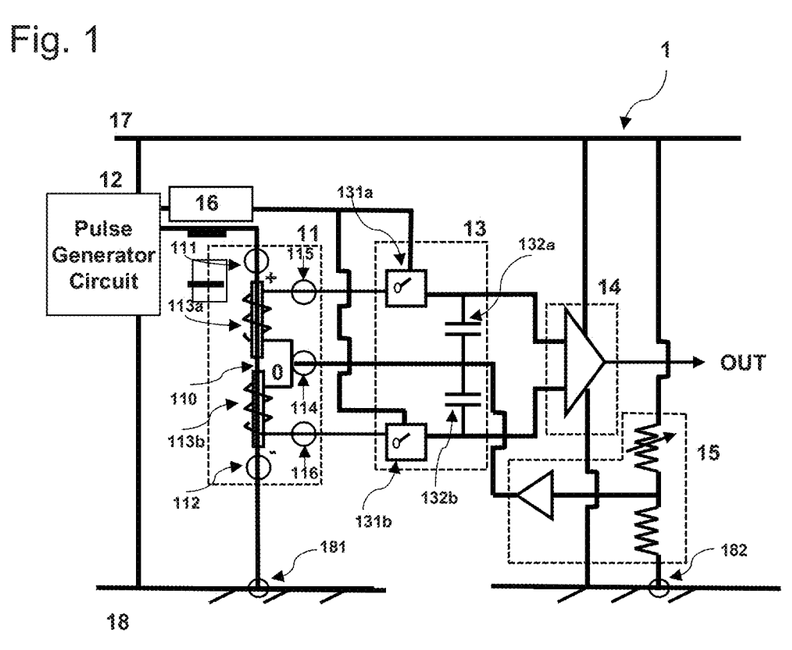
FIG. 1 shows a circuit block with a differential amplifier circuit related to Example 1.

Example 1 relates to a magnetometer using a GSR sensor applicable to an electronic compass and its circuit block is shown in FIG. 1.

The magnetometer 1 of Example 1 comprises a differential element 11 with a magnetic wire sensitive to a magnetic field, a pulse generator circuit 12 for supplying a pulse current to the magnetic wire, an adjustment circuit 16 for detection timing, a differential sample holding circuit 13 for holding two coil output voltages with the same absolute voltage value against a reference electrode potential set up by a neutral coil electrode 114, a differential amplifier circuit 14 for amplifying the difference voltage between two sample holding coil output voltages, and a potential stabilizing circuit 15 for keeping the voltage of the neutral coil electrode around a middle value of an electronics circuit power source.

The coil of the differential element 11 is divided into a plus coil 113a and a minus coil 113b at its center point which connects to the neutral coil electrode 114. Both pickup coil voltages detected between the output electrode and the neutral coil electrode have the same voltage value with the opposite signs.

The differential element has a magnetic wire composed of CoFeSiB, a wire length of 0.2 mm, a diameter of 10 μm and a wire resistance of 4Ω, and the pickup coil with 25 coil turns and a coil resistance of 65Ω.

The electrode potential of the neutral coil electrode 114 is set to be a half of the potential of the electronics circuit power source 17 to make the output voltage of the differential amplifier circuit zero. It is adjusted by the neutral potential stabilizing circuit to make the output voltage of the differential amplifier circuit zero when the external magnetic field strength is zero.

The pulse generator 12 generates a pulse current to supply it to the magnetic wire and can control the rising time or the falling time of the pulse current to 0.5 nsec, that is, a pulse frequency of 1 GHz. It can also control the pulse current strength to 200 mA. The power source voltage is preferably kept between 1 V and 15 V for supplying the pulse current with a current strength of from 10 mA to 500 mA. The power source voltage is 2 V for supplying the pulse current with a current strength of more than 200 mA.

Two electronic switches 131a, 131b turn off at the moment when the coil output voltages reach the peak voltage. The peak voltage is held in the holding capacitors 132a, 132b. The adjustment circuit 16 for detection timing can control the detection time range from 0.2 nsec to 5 nsec according to the delayed time of the peak coil voltage from the switch off timing.

The capacity of the holding capacitors is 4 pF and the average number of times of the final output signal is 16 times to suppress the noise.

The electrode potential of the neutral coil electrode 114 fluctuates significantly at the moment of pulse current passage but the difference between the two voltages of the two sample hold circuits 13 composing two electronics switch 131a, 131b and two capacitors 132a, 132b and the differential amplifier circuit 14 amplifies the difference coil voltage between the plus coil 115 and minus coil 116 without any undesirable effect from large GND fluctuations at the moment of pulse current passage and outputs it as the sensor signal. The variation of the output voltage decreases from 5 mV to less than 1 mV.

Figure 4:
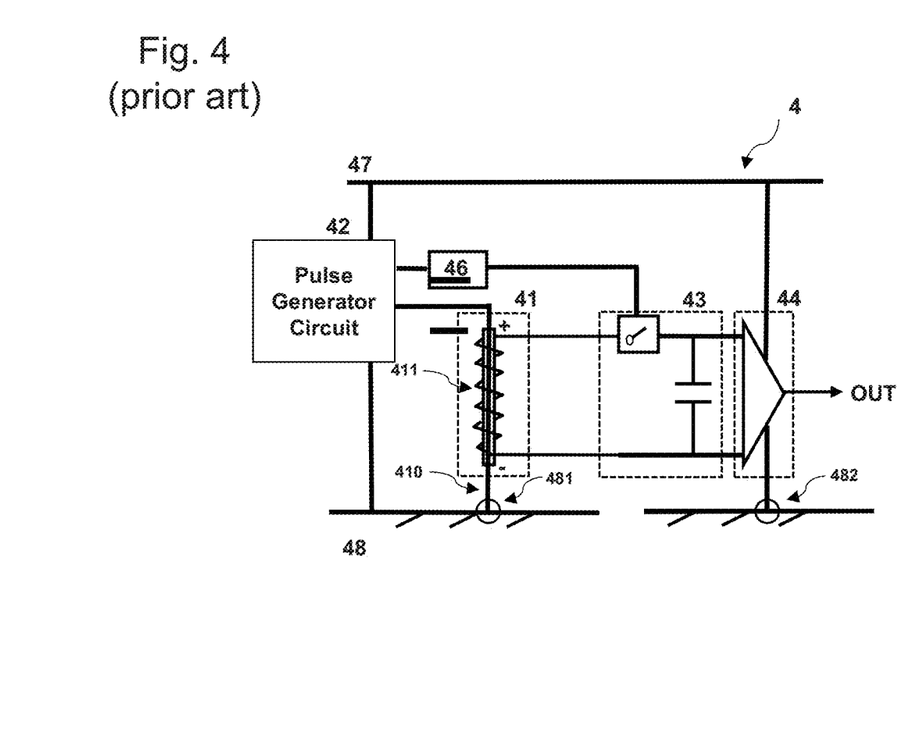
FIG. 4 shows a circuit block related to a current MI sensor.

Compared with a conventional GSR sensor having a single type GSR element processed by a single circuit shown in FIG. 4, Example 1 having the differential-type GSR element processing the differential circuit, can achieve 4 times better σ-noise from 2 mG to 0.5 mG than that of the conventional GSR sensor.

Example 2

Figure 2:
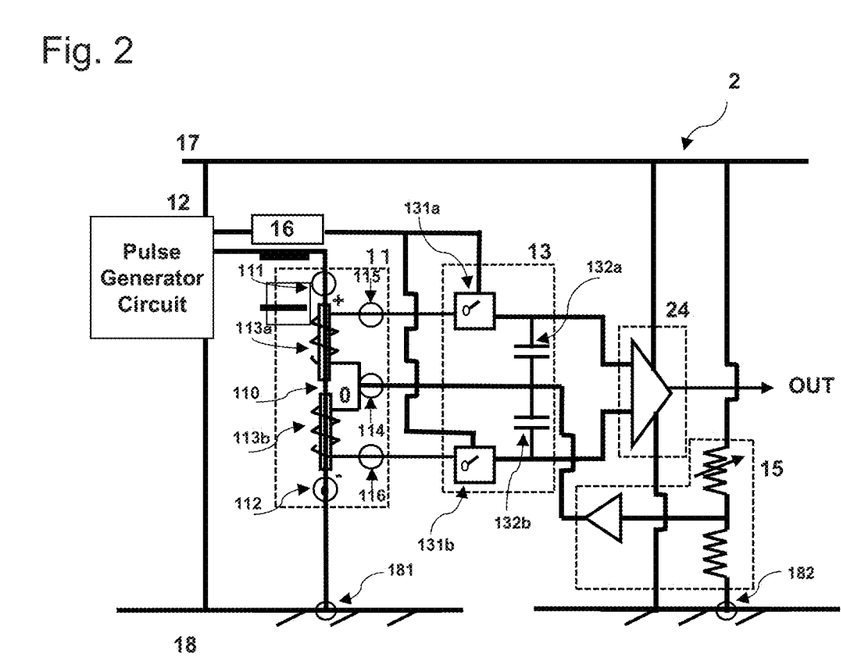
FIG. 2 shows a circuit block with a differential ADC related to Example 2.

Example 2 relates to a magnetometer using a GSR sensor applicable to an electronic compass and its circuit block is shown in FIG. 2.

The magnetometer 2 of Example 2 comprises a differential element 11 with a magnetic wire sensitive to a magnetic field, a pulse generator circuit 12 for supplying a pulse current to the magnetic wire; an adjustment circuit 16 for detection timing, a differential sample holding circuit 13 for holding two coil output voltages with the absolute voltage value of opposite signs against a reference electrode potential set up by the neutral coil electrode 114, a differential ADC 24 14 for amplifying the difference voltage between two sample holding coil output voltages, and a potential stabilizing circuit 15 for keeping the voltage of the neutral coil electrode around a middle value of an electronics circuit power source.

Example 2 is characterized by a differential ADC instead of the differential amplifier circuit of Example 1.

The differential element has a magnetic wire 110 sensitive to the magnetic field, a coil wound around its magnetic wire 113a, 113b to pick up the change of the wire longitudinal magnetizing and five electrodes that consists of two wire electrodes 111, 112, two coil electrodes 115, 116 and a neutral coil electrode 114.

The coil of the differential element 11 is divided into a plus coil 113a and a minus coil 113b at its center point which connects to the neutral coil electrode 114. Both pickup coil voltages 115, 116 detected between the output electrode and the neutral coil electrode 114 have the same voltage value with the opposite signs.

The differential element has a magnetic wire composed of CoFeSiB, the anisotropic field of 30G, a wire length of 0.2 mm, a diameter of 10 μm and a wire resistance of 4Ω and the pickup coils 113a, 113b with 42 coil turns and a coil resistances of 80Ω respectively.

The electric potential of the neutral coil electrode 114 is set to make the output voltage of the differential ADC zero by the potential stabilizing circuit 15 when the external magnetic field strength is zero.

The pulse generator 12 generates a pulse current to supply it to the magnetic wire with a wire length of 0.2 mm and a wire resistance of 4Ω. It can control the rising time or the falling time of the pulse current to 0.5 nsec, that is, a pulse frequency of 1 GHz. It can also control the pulse current strength to 200 mA. The power source voltage is 2V which can supply a pulse current with a current strength of more than 200 mA.

Two electronic switches 131a, 131b turn off at the moment when the coil output voltage reaches the peak voltage. The peak voltage is held in the holding capacitors 132a, 132b. The adjustment circuit 16 for detection timing can control the detection time range from 0.2 nsec to 5 nsec according to the delayed time of the peak coil voltage from the switch off timing.

The capacity of the holding capacitors 132a, 132b capacitors is 4 pF and the average number of times of the final output signal is 16 times to suppress the noise.

The electrode potential of the neutral coil electrode 114 fluctuates significantly at the moment of pulse current passage, but the difference between the two voltages of the two sample hold circuits 13 composing two electronics switch 131a, 131b and two capacitors 132a, 132b and the differential ADC 24 amplifies the difference coil voltage between the plus coil 115 and minus coil 116 without any undesirable effect from large GND fluctuations at the moment of pulse current passage and outputs it as the sensor signal. The variation of the output voltage decreases from 5 mV to less than 1 mV.

Compared with a conventional GSR sensor having a single type GSR element processed by a single circuit shown in FIG. 4, Example 2 having the differential-type GSR element processing the differential circuit, can achieve 4 times better σ-noise from 2 mG to 0.5 mG than that of the conventional GSR sensor.

Example 3

Figure 3:
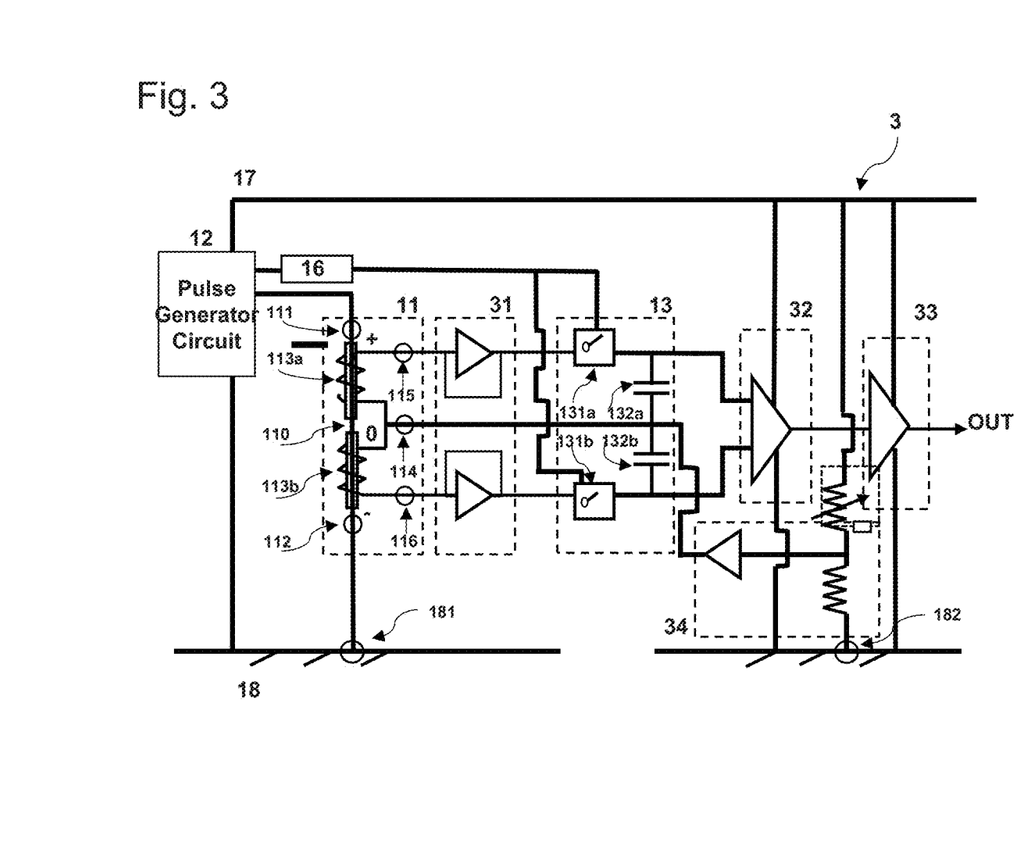
FIG. 3 shows a circuit block with a buffer circuit related to Example 3.

Example 3 relates to a magnetometer using GSR sensor for detecting the magnetism of a living body and its circuit block is shown in FIG. 3.

The magnetometer 3 of Example 3 comprises a differential element 11 that has a magnetic wire sensitive to a magnetic field, a pulse generator circuit 12 for supplying a pulse current to the magnetic wire, an adjustment circuit 16 for detection timing, a buffer circuit before a differential sample holding circuit 13 for holding two coil output voltages with the same absolute voltage value of opposite signs against a reference electrode potential set up by the neutral coil electrode 114, a differential amplifier circuit 14 for amplifying the difference voltage between two sample holding coil output voltages, and a potential stabilizing circuit 15 for keeping the voltage of the neutral coil electrode around a middle value of an electronics circuit power source.

The differential element has a magnetic wire 110 sensitive to the magnetic field, a coil wound around its magnetic wire 113a, 113b to pick up the change of the wire longitudinal magnetizing and five electrodes that consists of two wire electrodes 111, 112, two coil electrodes 115, 116 and a neutral coil electrode 114.

The coil of the differential element 11 is divided into a plus coil 113a and a minus coil 113b at its center point which connects to the neutral coil electrode 114. Both pickup coil voltages 115, 116 detected between the output electrodes and the neutral coil electrode 114 have the same voltage value with the opposite signs.

The differential element has a magnetic wire composed of CoFeSiB, an anisotropic field of 30G, a wire length of 2 mm, a diameter of 10 μm and a wire resistance of 20Ω and the pickup coils 113a, 113b with 600 coil turns and a coil resistances of 1KΩ respectively.

The electrode potential of the neutral coil electrode 114 is set to make the output voltage of the differential ADC zero by the potential stabilizing circuit 34 when the external magnetic field strength is zero.

The pulse generator 12 generates a pulse current to supply it to the magnetic wire with a wire length of 2 mm and a wire resistance of 20Ω. It can control the rising time or the falling time of the pulse current to 0.5 nsec, that is, a pulse frequency of 1 Ghz. It can also control the pulse current strength to 200 mA. The power source voltage is 5V which can supply the pulse current with a current strength of 200 mA.

When the coil resistance is 1 KΩ accompanied with a large number of coil turns, a buffer circuit 31 must be set between the differential element 11 and the differential sample hold circuit for suppressing IR voltage drop of the coil voltage caused by the coil current and the coil resistance. The buffer circuit used in this example is disclosed in Japanese Patent No. 5678358.

Two electronic switches 131a, 131b turn off at the moment when the coil output voltage reaches the peak voltage. The peak voltage is held in the holding capacitors 132a, 132b. The adjustment circuit 16 for detection timing can control the detection timing time within a range of from 0.2 nsec to 5 nsec according to the delayed time of the peak coil voltage from the switch off timing.

The capacity of the holding capacitors 132a, 132b is 20 pF and the average number of times of the final output signal is 16 times to suppress the noise.

The electrode potential of the neutral coil electrode 114 fluctuates significantly at the moment of pulse current passage but the difference between the two voltages of the two sample hold circuits 13 composing two electronics switch 131a, 131b and two capacitors 132a, 132b and it is amplified in the differential amplifier circuit 32 and transferred to ADC 33 subsequently converted to output digital signal The digital output signal is free from any undesirable effect from large GND fluctuations at the moment of pulse current passage and outputs it as the sensor signal. The variation of the output voltage decreases from 5 mV to less than 1 mV at the moment when the pulse passes through the wire.

The comparison with a conventional GSR sensor having single type GSR element processed by single circuit shown in FIG. 4 and Example 3 having the differential-type GSR element processing the differential circuit shows that Example 3 can decrease the noise density at 1 Hz from 10 pT to 4 pT.

INDUSTRIAL APPLICABILITY

The present invention makes improvements in the sensitivity, the noise, size, power consumption, etc., and contributions to increase the accuracy of electronic compasses used for smartphones, tablets, car navigation, digital cameras, 3-dimensional mice and so on. It also can detect the magnetism of a living body and make contributions to develop a wearable-type MCG and MEG systems.

LIST OF REFERENCE NUMERALS

1: circuit of Example 1,
11: differential element, 110: magnetic wire, 111: wire input electrode, 112: wire GND, 113a, 113b: pickup coil, 114: neutral coil electrode, 115: plus coil electrode, 116: minus coil electrode
12: pulse generator circuit
13: sample holding circuit, 131a, 131b: electronics switch, 132a, 132b
14: differential amplifier, 15: potential stabilizing circuit, 16: an adjustment circuit, 17: VDD power source,
18: GND, 181: pulse circuit GND, 182: signal processing circuit GND
2: circuit of Example 2, 24: differential ADC,
3: circuit of Example 3, 31: buffer circuit 32: differential amplifier circuit,
33: ADC circuit 34: a potential stabilizing circuit,
4: current circuit of Example 4,
41: element, 410: magnetic wire sensitive, 411: pickup coil, 42: pulse generator circuit,
43: sample holding circuit, 44: differential amplifier, 46: adjustment circuit, 47: VDD power source,
48: GND
481: pulse circuit GND, 482: signal processing circuit GND.

What is claimed is:

1. A magnetometer with an integrated circuit comprising:
a differential element which consists of one magnetic wire, two coils wound around the magnetic wire placed symmetrically at opposite ends of a middle coil point of the differential element, two wire electrodes for passing through a pulse current into the magnetic wire, a positive coil electrode, a negative coil electrode and a neutral coil electrode for detecting a coil voltage;
a pulse generator circuit to supply the pulse current to the magnetic wire;
an adjustment circuit which controls a time schedule of on and off of an electronics switch for achieving a detection timing at the positive coil electrode and the negative coil electrode;
a differential sample holding circuit for holding two coil output voltages with an absolute voltage value of opposite signs against a reference electrode potential set up by the neutral coil electrode;
a differential amplifier circuit for amplifying a difference voltage between two sample holding coil output voltages; and
a neutral potential stabilizing circuit comprising two resistors including one variable type for making the neutral coil electrode around a middle value of an electronics circuit power source.

2. The magnetometer with an integrated circuit of claim 1, further comprising:
a buffer circuit for stabilizing the neutral coil electrode, wherein the buffer circuit is disposed between the differential element and the differential sample holding circuit.

3. A magnetometer with an integrated circuit comprising:
a differential element which consists of one magnetic wire, two coils wound around the magnetic wire placed symmetrically at a middle coil point of the differential element, two wire electrodes for passing through a pulse current into the magnetic wire, a positive coil electrode, a negative coil electrode, and a neutral coil electrode for detecting a coil voltage;
a pulse generator circuit to supply the pulse current to the magnetic wire;
an adjustment circuit which controls a time schedule of on and off of an electronics switch for achieving a detection timing at the positive coil electrode and the negative coil electrode;
a differential sample holding circuit for holding two coil output voltages with an absolute voltage value of opposite signs against a reference electrode potential set up by the neutral coil electrode;
a differential ADC circuit for detecting a difference voltage between two sample holding coil output voltages; and
a neutral potential stabilizing circuit comprising two resistors including one variable type for making the neutral coil electrode around a middle value of an electronics circuit power source.

4. The magnetometer with an integrated circuit of claim 3, further comprising:
a buffer circuit for stabilizing the neutral coil electrode, wherein the buffer circuit is disposed between the differential element and the differential sample holding circuit.

* * * * *